United States Patent
Kolis et al.

(10) Patent No.: US 9,506,166 B1
(45) Date of Patent: Nov. 29, 2016

(54) METHOD FOR FORMING HETEROGENEOUS SINGLE GARNET BASED CRYSTALS FOR PASSIVE Q-SWITCHED LASERS AND MICROLASERS

(71) Applicant: Clemson University, Clemson, SC (US)

(72) Inventors: Joseph W. Kolis, Central, SC (US); Colin D. McMillen, Liberty, SC (US); J. Matthew Mann, Anderson, SC (US)

(73) Assignee: Clemson University Research Foundation, Clemson, SC (US)

( * ) Notice: Subject to any disclaimer, the term of this patent is extended or adjusted under 35 U.S.C. 154(b) by 317 days.

(21) Appl. No.: 14/332,672

(22) Filed: Jul. 16, 2014

Related U.S. Application Data (62) Division of application No. 12/832,108, filed on Jul. 8, 2010, now abandoned.

(51) Int. Cl.
| | | |
|---|---|---|
| *C30B 29/28* | (2006.01) | |
| *C30B 13/02* | (2006.01) | |
| *C01F 17/00* | (2006.01) | |

(52) U.S. Cl.
CPC ............ *C30B 13/02* (2013.01); *C01F 17/0025* (2013.01)

(58) Field of Classification Search
CPC ............ C30B 29/28; C30B 9/09; C30B 9/12
See application file for complete search history.

(56) References Cited

U.S. PATENT DOCUMENTS

| | | |
|---|---|---|
| 4,305,778 A | 12/1981 | Gier et al. |
| 5,066,356 A | 11/1991 | Ferretti et al. |
| 5,119,382 A | 6/1992 | Kennedy et al. |
| 5,394,413 A | 2/1995 | Zayhowski |
| 5,441,803 A | 8/1995 | Meissner |
| 5,502,737 A | 3/1996 | Chartier et al. |
| 5,563,899 A | 10/1996 | Meissner et al. |
| 5,761,233 A | 6/1998 | Bruesselbach et al. |
| 5,846,638 A | 12/1998 | Meissner |
| 6,025,060 A | 2/2000 | Meissner |
| 6,347,109 B1 | 2/2002 | Beach et al. |
| 6,834,070 B2 | 12/2004 | Zapata |

(Continued)

FOREIGN PATENT DOCUMENTS

| | | |
|---|---|---|
| EP | 0065382 A1 | 11/1982 |

OTHER PUBLICATIONS

Armstrong et al., "Novel composite structure Nd:YAG gain media for high power scaling of side-pumped configurations", *Optics Communications*, (2000), 175, pp. 201-207.

(Continued)

*Primary Examiner* — Robert M Kunemund
(74) *Attorney, Agent, or Firm* — Dority & Manning, P.A.

(57) ABSTRACT

Disclosed are heterogeneous crystals for use in a laser cavity and methods of forming the crystals. A crystal can be a monolithic crystal containing a garnet-based activator region and a garnet-based Q-switch. Disclosed methods include hydrothermal growth techniques for the growth of differing epitaxial layers on a host. A YAG host material can be doped in one region with a suitable activator ion for lasing and can be formed with another region that is doped with a saturable absorber to form the Q-switch. Regions can be formed with controlled thickness in conjunction. Following formation, a heterogeneous crystal can be cut, polished and coated with mirror films at each end for use in a laser cavity to provide short pulses of high power emissions using high frequency pulse modes.

17 Claims, 2 Drawing Sheets

(56) References Cited

U.S. PATENT DOCUMENTS

| | | | |
|---|---|---|---|
| 6,845,111 | B2 | 1/2005 | Sumida et al. |
| 6,944,196 | B2 | 9/2005 | Wittrock |
| 6,973,115 | B1 | 12/2005 | Ferrand et al. |
| 7,211,234 | B2 | 5/2007 | Kolis et al. |
| 7,374,616 | B2 | 5/2008 | Kolis |
| 7,540,917 | B2 | 6/2009 | Kolis et al. |
| 7,563,320 | B2 | 7/2009 | Kolis et al. |
| 7,591,896 | B2 | 9/2009 | Kolis et al. |
| 7,731,795 | B2 | 6/2010 | Kolis et al. |
| 2009/0041067 | A1 | 2/2009 | Meissner et al. |
| 2009/0151621 | A1 | 6/2009 | Kolis et al. |
| 2010/0189619 | A1 | 7/2010 | Kolis et al. |

OTHER PUBLICATIONS

Degnan, "Optimization of Passively Q-Switched Lasers" *IEEE Journal of Quantum Electroic*, 31, 11, (1995) pp. 1890-1901.

Forbes et al., "The hydrothermal syntheseis, solubility and crystal growth of $YVO_4$ and $Nd:YVO_4$", *Journal Crystal Growth*, 310 (2008), pp. 4472-4476.

Feldman et al., "Dynamics of chromium ion valence transformations in Cr, Ca:YAG crystals used as laser gain and passive Q-switching media", *Optical Materials*, (2003), 24, pp. 333-344.

B. Ferrand, et al., "Liquie phase eiptaxy: A versatile technique for the development of miniature optical components in single crystal dielectric media", *Optical Materials*. 11, (1999), pp. 101-114.

Huang et al., "Nd: YVO4 single crystal fiber growth by the LHPG method", J of Crystal Growth 229 (2001) 184-187.

Kolb, et al., "Phase Equilibria of $Y_3Al_5O_{12}$, Hydrothermal Growth of $Gd_3Ga_5O_{12}$ and Hydrothermal Epitaxy of Magnetic Garnets" *Journal of Crystal Growth*, 29, (1975), pp. 29-39.

R.A. Laudise, J.W. Nielson, *Solid State Phys.* 12 (1961) 149-222.

McDonald et al., "Reducing thermal lensing in diode-pumped laser rods", *Optics Communications*, (2000), 178, pp. 383-393.

Mill, *Sov Phys. Crystallogr.* 12 (1967) 195).

Okhrimchuk, et al., "Performance of YAG:$Cr^{4+}$ laser crystal"*Optical Materials*, 3, (1994) pp. 1-13.

Puttbach, et al., *J. Phys. Chem. Solids*, Suppl. 1, (1967) 569-571.

Song et al., Growth of composite sapphire/Ti sapphire by the hydrothermal method, *J. Crystal Growth*, 277, (2005), pp. 200-204.

Zayhowski, "Microchip Lasers", *Optical Materials*, 11 (1999) pp. 255-267.

Zayhowski, "Q-switched microchip lasters find real-world application" *Laser Focus World*, Aug. 1999, pp. 129-136.

Citation of Patent Applications—Related Applications Form.

METHOD FOR FORMING HETEROGENEOUS SINGLE GARNET BASED CRYSTALS FOR PASSIVE Q-SWITCHED LASERS AND MICROLASERS

CROSS REFERENCE TO RELATED APPLICATION

This application is a divisional application of U.S. patent application Ser. No. 12/832,108 having a filing date of Jul. 8, 2010 now abandoned, which is incorporated herein for all purposes.

STATEMENT REGARDING FEDERALLY SPONSORED RESEARCH OR DEVELOPMENT

This invention was made with government support under Grant No. FA9550-07-1-0566 awarded by the United States Air Force/Air Force Office of Scientific Research and under Grant No. DMR 0907395 from the National Science Foundation. The government has certain rights in the invention.

BACKGROUND

Typically, a solid state laser cavity contains a host material that is doped with a small amount of an activator ion. This ion can be pumped by a light source such as a flash lamp or more commonly, a diode laser of suitable frequency. The light from the pump is absorbed by the gain medium, i.e., the doped host, creating a population inversion that causes stimulated emission of coherent light. The output light can be in the form of continuous or pulsed emission.

While the gain medium can be the only crystal regime of a laser cavity, solid-state lasers often employ several single crystal regimes that serve a series of purposes. Typically these regimes occur in the form of a series of layers or films that have similar lattice structures and dimensions, but with slightly different chemical compositions where the different compositions reflect the different functions. For instance, some applications require a high-powered pulse. This can be achieved using relatively low pump power and a Q-switch employed in conjunction with the gain medium. Accordingly, short pulses of high power emissions using high frequency pulse modes can be provided.

Techniques of Q-switching encompass either active or passive methods. The active method provides excellent control but is quite complex. The passive mode is far simpler and requires only a suitable saturable absorber material. The absorber material is a solid-state host doped with a minor amount of an ion (i.e., a Q-switch ion) that serves as passive trigger and is usually tailored to match the output light of the particular activator ion of the laser. Once light saturates the absorber, transmittance through the saturable absorber material rapidly increases (often referred to as "bleaching") and the absorbed energy is emitted from the laser cavity as a pulse of short duration with a high peak power.

This system is particularly suitable for diode pumped solid-state microlasers. A typical design employs a crystal doped with a suitable activator ion pumped with a modest powered diode laser and capable of emitting between about 10 and 100 mW. Generally the laser cavity is very small, on the order of 1 mm. This requires only a minimal power supply and small diode pump laser. To obtain short bursts of higher peak powers of several kW for a few nanoseconds a passive saturable absorber Q-switch is utilized in conjunction with the emission material. Passive saturable absorber Q-switches have been previously described (see, e.g., U.S. Pat. No. 5,394,413 to Zayhowski). Attempts have been made to improve efficiency of such processes by minimizing optical loss between the emission of the gain medium and the absorption of the saturable absorber, for instance through utilization of certain dopant combinations such as $Nd^{3+}$ and $Cr^{4+}$ (see, e.g., Okhrimchuk, et al., *Opt. Mater.* 3 (1994) 1-13; Degnan, *IEEE J. Quantum Electron.* 31 (1995) 1890-1901; U.S. Pat. No. 5,119,382 to Kennedy, et al.).

Additional crystal regimes can be incorporated into a laser cavity including those to obtain thermal management, mechanical strength, waveguiding capabilities, and the like. Thermal management is a significant matter particularly with regard to high-energy solid-state lasers. For instance, thermal lensing and surface distortion become a significant matter for higher power applications during which residual heat buildup can be localized in the active lasing cavity in a non-uniform fashion. This leads to irregular thermal expansion of the lattice and reduces the quality of the beam. Many of these issues have been summarized in the technical literature (for example Armstrong et al. *Optics Comm.* 2000, 175, 201; McDonald et al. *Optics Comm.* 2000, 178, 383), as well as the patent literature (see, e.g., U.S. Pat. No. 6,845,111 to Sumida, et al., U.S. Pat. No. 6,944,196 to Wittrock, and U.S. Pat. No. 5,761,233 to Bruesselbach, et al.). In thin disk lasers it is often desirable to have a thin layer region doped with activator ions on a thicker undoped region that serves a supporting substrate. Such devices have been described in e.g., U.S. Pat. No. 6,347,109 to Beach, et al, and U.S. Pat. No. 6,834,070 to L. E. Zapata.

In one design both the activator solid and the secondary function material, e.g., the Q-switch, are based on the same host and only differ in the particular ion doped into the host lattice. Since the dopant ion is often similar in size to the other metal ions in the lattice and is only present in small amounts (usually between 0.1 and 10%), the lattice size and structure is mostly unaffected.

In many applications the different regions are relatively small. For example a gain medium can be between about 0.5 and about 1.0 mm in thickness, while a Q-switching region can be between about 0.03 and about 0.5 mm in thickness. In addition to crystal phases, the crystal surfaces can be coated with multiple dielectric films to control reflection and absorption, but these add little to the overall length of the laser cavity. Small size of the components can reduce the pulse width and lead to a very small, simple laser cavity that provides an output beam having a high repetition rate of high peak powers with short duration and single mode well-shaped pulses. These small, simple, rugged devices are called microlasers and have the advantages of modest input power but brief coherent high peak output. Microlasers are useful for various applications including range finding, optical communication, micromachining, environmental monitoring and many other applications (see, e.g., Zayhowski, *Opt. Mater.* 11 (1999) 255-267; Zayhowski, *Laser Focus World*, August 1999).

To create a solid-state laser cavity with multifunctionality, it is necessary to produce the various regions attached to one other through a robust and precise bonding mechanism. Construction is complicated by the need for very precise control of the concentration dopant ion and thickness of the layers. Furthermore, if the resultant output beam is to be frequency manipulated through a non-linear process (for example second harmonic generation or optical parametric oscillation), it is useful to have an output with controlled polarization. All of these requirements lead to the need for very exact control over the various layers in a solid-state device.

There are two general techniques presently in use to form multifunctional crystal devices. One method is direct bonding of different premade materials. Use of glues, fluxes or other bonding materials has been examined but is usually unacceptable due to degradation of the optical beam quality. Other direct bonding methods include pressure bonding, electrical potential fusion and other techniques, but these are often expensive, unreliable or otherwise not practical for scalable production of layers between 50-1000 microns (µm). Bonding methods have been described in, e.g., U.S. Pat. Nos. 5,441,803, 5,563,899, 5,846,638, 6,025,060 and U.S. Patent Application Publication No. 2009/0041067.

A second method has been the growth of layers directly on a suitable substrate to form a monolithic composite. Typically this has been accomplished through epitaxial growth in which one material acts as a substrate and a second material is deposited on the surface in a stepwise controlled manner. The grown layer adopts the general structural characteristics of the substrate (such as same lattice type and similar dimensions). Generally this process requires that the two materials have a similar structure type and reasonable crystal lattice match. In the case of solid-state laser devices, the use of gas phase epitaxial methods (molecular beam epitaxy, physical vapor deposition, MOCVD etc.) have not been suitable as gas phase methods are too slow to form the desired layer thickness (such as 0.1-1 mm).

Liquid phase epitaxy (LPE) as described by B. Ferrand, et al. (see, e.g., *Opt. Mater.* 11 (1999) 101-114; U.S. Pat. No. 6,973,115; EP Patent No, EP-A-0 653-82) has also been used to grow layers of suitable thickness. LPE employs high temperature fluxes to dissolve the substrate material and deposit the appropriate layers on the substrate seed via supersaturation. It typically employs molten salts that are usually mixtures of lead oxide and boron oxide or other metal oxides that melt between 1200° C. and 1600° C. and impart modest solubility to the desired layer material. Unfortunately, the LPE method often utilizes highly toxic lead-based solvents and requires very high temperature processing, leading to increased environmental danger and costs. Additionally, the formed boule must be treated to spin away flux and cleaned with nitric acid to remove any residual flux. Furthermore, the high temperature solvents often contaminate the resultant product with the flux and/or impurities in the flux.

Hydrothermal techniques, in which a temperature differential is developed to create a supersaturated solution leading to crystal growth on a seed, have been utilized for bulk single crystal growth (see, e.g., R. A. Laudise, J. W. Nielson, *Solid State Phys.* 12 (1961) 149-222), but are not well known for use in forming heterogeneous materials. For example electronic grade quartz is grown commercially by the hydrothermal method. Other crystals, such as potassium titanyl phosphate (KTP) are grown by both flux and hydrothermal methods, and it is widely acknowledged by those familiar with the art that the hydrothermally grown products are of generally superior quality.

What are needed in the art are methods for forming solid state laser devices incorporating multiple crystal regimes that are more economical than previous methods. For example, a low temperature, facile process that can provide a monolithic heterogeneous crystal including a Q-switch for use in a laser cavity would be of great benefit.

SUMMARY

According to one embodiment, disclosed is a method for forming a monolithic heterogeneous crystal that includes a Q-switch region. For instance, a method can include heating and pressurizing an aqueous solution held within a reactor to develop a temperature differential between a first zone of the reactor and a second zone of the reactor. The reactor can include a garnet feedstock in the first zone and a garnet seed crystal in the second zone. More specifically, the garnet formed by the feedstock is the same garnet as the garnet of the seed crystal. The feedstock can include a source for a saturable absorber ion (i.e., a Q-switch ion). Upon heating and pressurizing the contents of the reactor, growth of a garnet Q-switch crystal region can be initiated on the garnet seed crystal to form a monolithic product crystal. Additionally, the composition of the Q-switch crystal region can differ from the composition of the seed crystal such that the monolithic product crystal is heterogeneous.

In one preferred embodiment, the garnet seed crystal can be a YAG seed crystal.

In addition, the product can include an activator ion. For instance, either the garnet seed crystal can include an activator ion, or the feedstock can include a source for an activator ion. Other materials can be included in the feedstock as well, such as a source of an ion for balancing lattice charge of the Q-switch crystal region.

A method can include forming additional crystal regions on the Q-switch region. For instance, a new undoped crystal region can be formed on the Q-switch region. A new region can also be formed according to a hydrothermal growth method as disclosed herein.

Also disclosed is a monolithic heterogeneous crystal as may be formed according to disclosed methods. For instance, a crystal can include a first region and a second region immediately adjacent to one another, the first and second region including the same garnet host material, but the composition of the first region can differ from the composition of the second region. One of the regions of the crystal can be a Q-switch region and can include a saturable absorber ion. In addition, the crystal can include an activator ion, either in the Q-switch region or in an adjacent region.

Also disclosed are products that can incorporate the disclosed heterogeneous garnet based materials, such as microlasers.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

In general, disclosed herein are processes for manufacturing a heterogeneous crystal for use in a laser cavity and crystals formed according to the disclosed methods. A method can include a hydrothermal growth technique for the growth of differing epitaxial layers using a garnet host material such as $Y_3Al_5O_{12}$ (YAG) that can be doped in one region with a suitable active lasing ion such as $Nd^{3+}$ or $Yb^{3+}$ to form an emission region, and can be doped in another region with a suitable saturable absorber material, i.e., a Q-switch ion, such as $Cr^{4+}$ to form a Q-switch. Additional layers that can provide other functions such as, e.g., thermal control, waveguiding capabilities, and the like can also be included in a monolithic construct. Beneficially, a hydrothermal growth process can be used to grow and develop one or more regions of a YAG-based crystal with controlled thickness. Following formation, a heterogeneous crystal can be further processed as desired. For instance, a formed crystal can be cut, polished and coated with mirror films at each end for use in a microlaser cavity. While the present discussion is primarily concerned with formation of microlasers, it should be understood that the subject matter is not limited to a microlaser cavity application. Disclosed methods can also be utilized to form monolithic crystal structures that can act as a source for high-energy continuous wave laser cavities.

A hydrothermal growth method can eliminate the use of molten flux solutions as are needed for LPE. By eliminating the fluxes from the growth process, a number of steps can be saved including the need to spin away flux and clean the boules with nitric acid to remove any residual flux. Furthermore, the high temperature solvents utilized in LPE often contaminate the resultant product with impurities in the flux or the flux themselves. A hydrothermal growth method eliminates the need for highly toxic lead-based solvents that are often the LPE solvents of choice in YAG growth methods.

Figure 1:
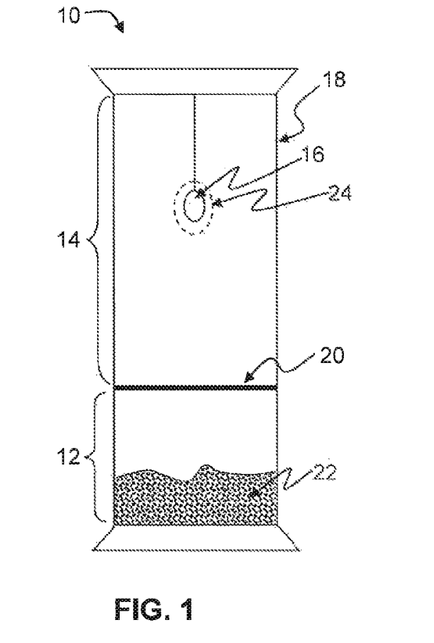
FIG. 1 is a schematic diagram of one embodiment of a hydrothermal growth system as described herein.

FIG. 1 illustrates one embodiment of a hydrothermal system 10 as may be utilized in a process. In general, a hydrothermal process involves the use of a superheated aqueous solution (liquid heated above its boiling point) under pressure to cause transport of soluble species of a refractory oxide from a nutrient rich zone 12 to a supersaturated zone 14. As the refractory oxide is not sufficiently soluble in the superheated water, the species will crystallize, either spontaneously according to primary nucleation or alternatively on a seed crystal 16 located in the supersaturated zone 14.

A process can generally take place within a reactor 18. Depending on the chemical demands of the specific system a reactor 18 can be lined with a noble metal such as silver, gold, platinum, palladium, etc. For instance, a liner can be either fixed liner or a floating liner. A fixed liner can encompass a lined reactor 18 that is a stand alone autoclave that can carry the reactants, products, etc. A floating liner can be a smaller reactor containing the reactants that can be held within a larger autoclave. For instance, an autoclave can contain one or more floating liners in the form of smaller tubes, e.g., silver tubes, each of which is loaded with reactants, water, seed crystals, etc. and each of which functions as a reactor within a larger autoclave. Other materials for formation of a reactor are generally known in the art and include, without limitation, metals, quartz, ceramics, Teflon®, and so forth.

A reactor 18 is generally sealable, as with a cold seal, and can be of any desirable size depending, for example, on whether a process utilizes a fixed or floating liner, the size of product crystal to be formed by the process, energy requirements (e.g., temperatures and temperature gradient during a process), and so forth. For instance, a stand alone autoclave reactor with either fixed liner or unlined can generally be between about 1 cm and about 10 cm in a cross sectional dimension and between about 4 cm and about 100 cm in height. A floating liner reactor can generally be smaller (though not necessarily so), for instance between about 0.25 cm and about 2 cm in diameter and between about 2.5 cm and about 10 cm in height. Of course, larger and smaller reactors are also encompassed herein.

A reactor 18 can include a baffle 20 between a nutrient rich zone 12 and a supersaturated zone 14. A baffle 20 can be formed of the same or different material as the wall of the reactor 18. For instance, when considering a silver lined or floating reactor 18, baffle 20 can also be silver or silver lined. Baffle 20 can include at least one hole therethrough for passage of solution from the nutrient rich zone 14 to the supersaturated zone 20. A baffle 20 can aid in maintaining a temperature differential between the two zones and can encourage substantially isothermal characteristics in each zone. Baffle 20 can also restrict convection flow between nutrient rich zone 14 and supersaturated zone 20 and can channel the convection flow across the baffle 20 into a desirable geometry.

System 10 can also include heaters, insulators, controllers, etc. as are generally known in the art (not shown on FIG. 1). For instance, a system 10 can include an air space between insulation and the reactor wall. There can also be vents at strategic places to allow air flow to be controlled. Changing vent parameters and power delivered to heaters can determine the thermodynamic condition of the reactor. Additionally, though illustrated in a vertical arrangement with the nutrient rich zone 14 below the supersaturated zone 20, this is not a requirement of the disclosed process, and the two zones can be located in any suitable location with regard to one another, for instance in a horizontal or any other angled relationship, as long as a temperature differential between the two can encourage convective flow there between.

According to one embodiment, a seed crystal 16 can be placed in the growth zone 14 to facilitate crystallization of a dissolved feedstock 22 from a supersaturated solution. In general, a seed can be formed of a doped or undoped garnet host material and can be a homogeneous or heterogeneous crystal. In one preferred embodiment, the host material can be YAG, but this disclosure is not restricted to only YAG. Many other formulations of the garnet structural type can be utilized. For example $Gd_3Sc_2Ga_5O_{12}$ (GSGG) or $Lu_3Al_5O_{12}$ (LuAG) or $Gd_3Ga_5O_{12}$ (GGG) are non-limiting examples. These hosts can also serve as the basis for laser cavities in solid-state lasers and microlasers by growing epitaxial layers using the hydrothermal methods. Laser device crystals based upon other garnet host materials can be grown using similar hydrothermal epitaxial growth methods under approximately similar conditions of temperature pressure and mineralizer as discussed at further length herein with regard to YAG.

By way of example, YAG doped with an activator ion can be utilized as a seed crystal 16. For instance, a seed crystal 16 can be an $Nd^{3+}$ or $Yb^{3+}$ doped YAG crystal including between about 0.1 atomic % (at. %) and about 10 at. % dopant for use as an emission regime in a laser cavity. Seed crystal 16 can be doped with essentially all of the suitable trivalent laser active ions including but not limited to $Nd^{3+}$ and $Yb^{3+}$. For instance, for operation of a Q-switched microlaser in the vicinity of about 2.0 µm wavelength, YAG doped with $Tm^{3+}$ along with $Ho^{3+}$ can be utilized.

A seed crystal can be a synthetic or natural material and may be obtained according to any formation process as is generally known. For instance, a seed crystal can be grown from a melt using standard process such as Czochralski pulling, or alternatively cut from a larger crystal formed according to such a process or purchased on the retail market. A crystal can be cut and polished to a [100] orientation and hung as a seed crystal 16 in reactor 18.

A process can be carried out with a seed crystal 16 of any suitable size, the size being limited generally according to the diameter of the reactor 18. The seed crystal 16 can be fairly uniform in thickness and dopant concentration. For instance, a seed crystal can be in any desired shape (rod, disc, sphere, ovoid, etc.) about 1 mm in diameter, about 1 cm in diameter, or larger, as desired.

Included in system 10 can be a feedstock 22 located in the nutrient rich zone 12 of reactor 18. An illustrative example of a process is one in which suitably doped YAG feedstock 22 can be transported in hydrothermal fluids to a YAG substrate seed 16 to form a layer of doped YAG 24 of appropriate thickness on the seed 16.

A feedstock 22 can include the YAG host material or sources for forming the host material a powdered form. For instance, a feedstock can include excess amounts of $Y_2O_3$ and $Al_2O_3$ or alternatively premade YAG powder. A feedstock can also include a source for the desired saturable absorber material for forming a Q-switch region.

In one embodiment, seed crystal 16 can include a YAG host material doped with an activator ion such as $Nd^{3+}$ or $Yb^{3+}$. These two ions emit in the 1.03-1.06 µm region, which is a suitable region for $Cr^{4+}$ to act as a saturable absorber ion. Thus, the feedstock 22 can include a source for $Cr^{4+}$ dopant, including, without limitation $CrO_2$, $Cr(NO_3)_3$, and so forth. Because $Cr^{4+}$ can replace a trivalent metal ion ($Al^{3+}$) in the host YAG lattice, an equimolar amount of divalent metal ions can also be included in the feedstock to prevent defects centers in the formed crystal structure. Accordingly, $Cr^{4+}$ ion can be doped into YAG with the use of an equimolar amount of a divalent ion such as $Ca^{2+}$ or $Mg^{2+}$ as charge compensation.

Alternatively, Cr ion can be introduced as $Cr^{3+}$ directly into the lattice and then converted into the suitable $Cr^{4+}$ in a tetrahedral coordination site. For instance, an oxidant may be added to the hydrothermal solution. Suitable oxidants can include, without limitation, $NO_3^-$ or $H_2O_2$, for example. Alternatively, a trivalent Cr source can be converted by controlled heating after growth (see, e.g., Feldman et al., *Optical Materials* 2003, 24, 333-344.) This is a relatively simple process in that $Cr^{3+}$ is the most stable oxidation state under growth conditions so it can be added by simply including the appropriate amount of a soluble $Cr^{3+}$ source (for example $CrCl_3$) into the feedstock. Once the $Cr^{3+}$ ion is included in the lattice it can be converted to the suitable $Cr^{4+}$ material using methods as are generally known in the art.

Another saturable absorber as may be incorporated as a Q-switch material is divalent cobalt, $Co^{2+}$, for instance in conjunction with a gain medium such as Er doped YAG that operates in a region of about 1.5 to about 1.7 µm. A suitable source of divalent cobalt such as CoO, $CoCl_2$ or similar material can be included in the feedstock. Since the divalent $Co^{2+}$ will be substituting for a trivalent ion in the lattice, it is desirable to have a similar amount of a tetravalent co-dopant for charge balance purposes. One possible co-dopant is silicon. In one embodiment, a corresponding amount of $SiO_2$ can be added to the feedstock to balance the $Co^{2+}$ substitution in the Q-switch layer. These additives can be readily mineralized along with the lattice host materials under the hydrothermal growth conditions described herein, and so can be readily incorporated into epitaxial layers.

The dopant of the Q-switch material can generally be provided in the feedstock in a concentration between about 0.01 at. % and about 10 at. %. The concentration of a dopant in a crystal region can be controlled very precisely through the addition of appropriate starting materials as feedstock. This control provides for the control of performance characteristics and lattice size. More specifically, by use of disclosed methods, dopant concentration can be maintained at a constant level throughout growth, rather than at an ever changing concentration throughout growth as in some flux methods. Thus, the formed crystal region can include the dopant at a constant level throughout the region, which can provide an improved lattice structure and performance.

The aqueous solution used in a hydrothermal process can include a mineralizer that can facilitate dissolution and transport of the feedstock. A mineralizer can include one or more small ionic species and can be added to the hydrothermal solution. Ions include but are not limited to $OH^-$, $CO_3^{2-}$, $F^-$, $Cl^-$, $NO_3^-$ and $H^+$ or concentrations thereof. Control of identity and concentration of a mineralizer can facilitate both the rate and quality of crystal growth. Mineralizers and parameters for their use are well known to those practiced in the art and have been used for the growth multiple electro-optic crystals such as KTP (see, e.g., U.S. Pat. No. 4,305,778 to Gier and U.S. Pat. No. 5,066,356 to Ferretti, et al., both of which are incorporated herein by reference).

The concentration of a mineralizer used in a process can vary, as is known. In general, mineralizer concentration can vary between about 1M and about 30M, or even higher in some embodiments. In one embodiment a carbonate mineralizer can be used in a concentration between about 3M and about 8M.

During a process, a superheated hydrothermal fluid can be contained in a reactor under pressure, typically between about 5 kpsi and about 30 kpsi. Growth and supersaturation control is achieved in a process by the use of a differential temperature gradient across a reactor. Referring again to FIG. 1, a nutrient rich zone 12 can be heated and feedstock 22 can dissolve in the hot hydrothermal fluid. The solution in the nutrient rich zone 12 becomes a saturated solution. The supersaturated zone 14 can be held at a slightly lower temperature. Consequently, the solution in the nutrient rich zone 12 can convect upward through the baffle 20 and into the supersaturated zone 14 where it will cool and become supersaturated. The dissolved feedstock can begin to come out of solution and build upon the crystal structure of the seed 16. The process will continue until stopped or the feedstock supply is consumed.

A feedstock 22 of YAG doped with suitable concentration of $Cr^{4+}$ and $Ca^{2+}$, or a feedstock containing undoped YAG and $CrO_2$ and CaO can be placed in the reactor 18 along with an aqueous phase containing an appropriate concentration of a suitable mineralizer. The reactor 18 can be sealed and a suitable temperature gradient can be established.

Among the advantages of a hydrothermal crystal growth process is the low operating temperatures. For instance, a growth process can generally be carried out at upper temperatures in the dissolution zone of between about 500° C. and about 650° C., or between about 450° C. and about 620° C. in the growth zone, which can be 800° C. to 1200° C. lower than an LPE method. This can simplify operating conditions and drastically minimize the amount of thermal strain regions in a forming crystal. The thermal gradient between the two zones of a reactor can likewise vary according to specific materials and growth rates desired, but typically can be between about 20° C. and about 100° C.

The temperature gradient can be maintained for a length of time to deposit of an epitaxial layer 24 of YAG that is doped with the selected amount of $Cr^{4+}$. The doped material 24 can grow on the seed 16 and can essentially be an identical part of the same crystal lattice as the substrate, distinguishable only by the dopant, e.g., $Nd^{3+}$ and/or $Yb^{3+}$ in the activator regime and $Cr^{4+}$ in the saturable absorber region. For instance, the deposited layer 24 can adopt the same orientation as the seed (for example [100]) allowing for control of polarization of the resultant beam. This may be preferred in applications in which the laser radiation emitted by a device is desirably frequency converted using second harmonic generation or optical parametric oscillation (for example from 1064 nm to 532 nm light). In these cases it is highly desirable to have a cavity crystal that can emit polarized light for subsequent frequency conversion by an appropriate nonlinear optical crystal (such as KTP, BBO, LBO etc). One preferred face in YAG or other garnets that can emit polarized light is the [100] face so it is desirable to grow the epitaxial layers of activator and Q-switch on this [100] face. However, deposited layer 24 may optionally be grown on other seed faces and the resultant coherent light emission may be polarized for further manipulation.

In general, growth rate of a developing region can be between about 1 and about 5 microns per hour, or between about 30 and about 100 microns per day. The identity and concentration of a dopant typically has no effect on the rate of layer growth. Rather, the rate of crystal growth can be controlled by the identity and concentration of a mineralizer as well as the temperature gradient across the reactor and the nature of the host material. The relatively slow growth rates possible can be beneficial as this can allow for precise control of the thickness of the forming crystal. For example, a process can reliably grow a region at about 2 microns/hour or about 25 microns/day and can thus be used to grow a region of about 100 microns over four days. Generally, preferred growth conditions for any specific system can be specific to the particular host lattice, as is known in the art.

Disclosed methods can be readily scaled to large numbers of samples simultaneously so time is not a hindering factor. Moreover, once a process is started it can require no operator input over the course of the reaction and can be replicated reliably many times. As such, the total time of growth can be of little consequence in the overall production process.

A process can be a simple single step process and can deposit regions of various shapes such as rods or disks. Typically formed regions can be several hundred microns to several millimeters thick, though larger or smaller materials can be formed.

Figure 2:
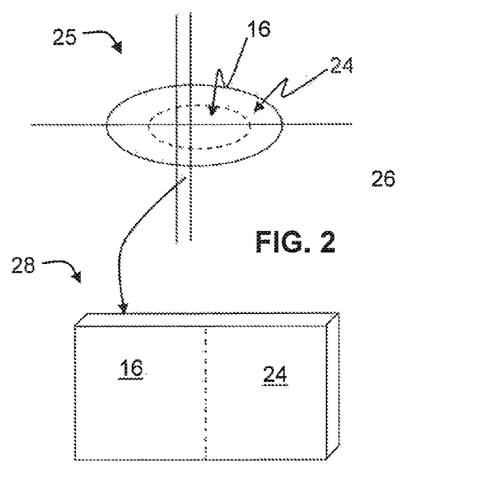
FIG. 2 is a schematic diagram of one embodiment of a method for forming a cut heterogeneous single crystal as described herein.

FIG. 2 illustrates one embodiment of a heterogeneous as-formed crystal 25 including YAG-based activator crystal region 16 and Q-switch region 24. Product crystal 25 can be a large area substrate that can be polished and processed using techniques well known to those in the art. For example, a crystal 25 can be cut as shown by the dashed lines to form a final product crystal 28 including gain medium 17 for use in a laser cavity. In one embodiment, crystal 28 can be polished and coated with appropriate reflective coatings and cut into many pieces to form a large number of microlaser cavity devices. The end result can be a laser cavity crystal 28 that is a compact rugged monolithic single crystal microlaser with high peak powers.

Figure 3:
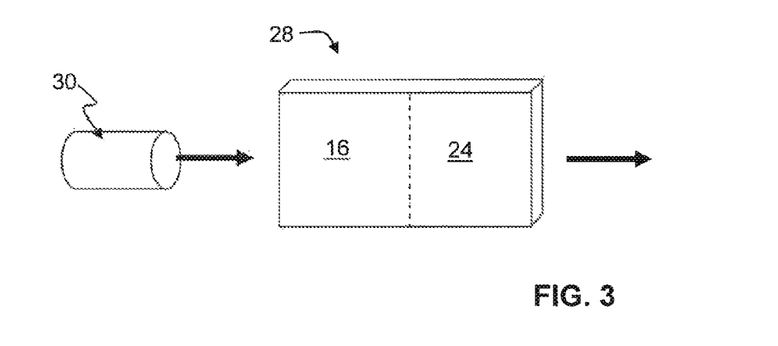
FIG. 3 is one embodiment of a laser system incorporating a heterogeneous monolithic crystal as described herein.

As illustrated in FIG. 3, during use, a light source 30 such as a flash lamp or diode laser can pump light into crystal 28, including emission region 16 and Q-switch region 24. Once light saturates the absorber of the Q-switch 24, transmittance through the saturable absorber material rapidly increases (often referred to as "bleaching") and the absorbed energy is emitted from the emission region 16 as a pulse with a high peak power.

According to another embodiment both the activator ion and the Q-switch dopant ion can be provided in the same region of a heterogeneous crystal. In this embodiment, the dopant ions (such as $Nd^{3+}$), Q-switch ions (such as $Cr^{4+}$) and counterbalancing charge ions (such as $Ca^{2+}$) can all be placed in the feedstock mixed with YAG feedstock. Using the same transport conditions and mineralizers as described above, an epitaxial layer including a mixture of all the dopant ions can be grown on a suitable undoped YAG single crystal seed to form one multifunctional layer grown on the substrate.

One advantage of disclosed methods is that they can be simply and economically scaled to large volume production. A hydrothermal epitaxial growth method can be utilized to grow crystal regions on very large area substrates limited only by the inner diameter of the reactor. If a reasonably large boule is used as a seed (e.g., about 1 to about 2 inches), the formed heterogeneous product can be cut into multiple microlaser cavity crystals making this process an extremely cost effective one. For example, an original seed crystal with 25×25 millimeter dimension (or 625 $mm^2$ surface area) can produce in excess of 400 microlaser chips with 2×2 millimeter dimensions (allowing for edge defects and kerf loss) after only a few days of hydrothermal epitaxial growth. Since the volume of each particular run is limited only by the dimensions of the seed and the inner diameter of the reactor, the ability to scale production to large volumes of devices is readily apparent. A hydrothermal process can provide very uniform, homogeneous and monolithic layer growth for each region because each layer can be grown out of highly mobile and homogenous soluble growth solution, and thus can be used to reliable develop large heterogeneous monolithic crystals.

A hydrothermal growth method as disclosed herein can be utilized in forming additional regimes on a single structure, in addition to activator and Q-switch regimes as described above. Specifically, any number of desired layers can be grown successively on previous layers.

Figure 4:
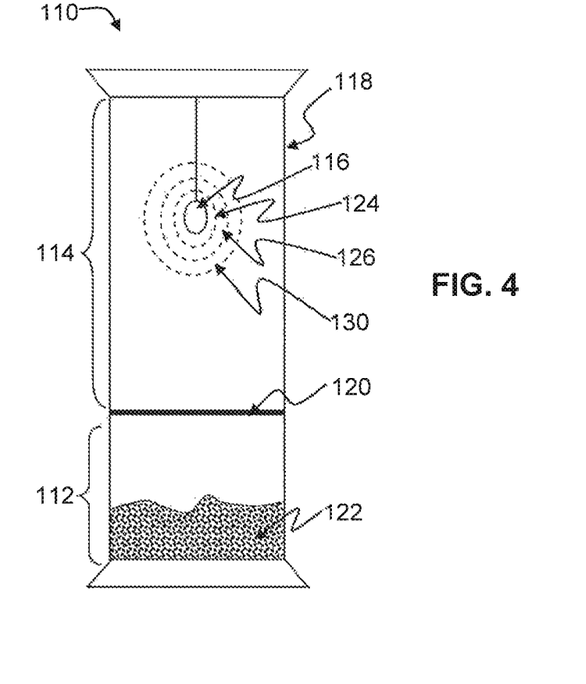
FIG. 4 is a schematic diagram of another embodiment of a hydrothermal growth system as described herein.

For instance, and with reference to FIG. 4, a seed crystal 116 of undoped YAG can be located in a reactor 118. The use of the hydrothermal technique to grow single crystals of undoped YAG has been reported (Kolb, et al., *J. Cryst. Growth* 29 (1975) 29-39; Puttbach, et al., *J. Phys. Chem. Solids*, Suppl. 1, (1967) 569-571; Mill, *Sov. Phys. Crystallogr.* 12 (1967) 195). A layer of undoped YAG can be functional in thermal control of a laser cavity. According to this embodiment, a layer 124 of a YAG material doped with an activator ion (such as $Nd^{3+}$, $Yb^{3+}$ or $Er^{3+}$ for example) can be grown on undoped YAG seed crystal 116. Following, a second layer 126 of a YAG material doped with saturable absorber can be formed on the first layer 124, and finally another layer 130 of undoped YAG formed on the second layer 126. This hydrothermal epitaxial growth technique can be used to prepare a YAG crystal specifically designed for high-energy applications and very high peak pulse power.

A primary problem for high-energy applications is the issue of thermal lensing. At pump powers above 2W thermal lensing effects begin to occur. In this case, the excess heat of the intense pump power begins to distort the lattice containing the absorbing gain ions. As the lattice distorts, it not only affects the beam quality but more significantly it can crack the thin dielectric coating layers. Thus for high-energy applications it may be desirable to add a relatively thick layer of undoped host material after the Q-switching layer is grown but before the dielectric coating is applied.

Figure 5:
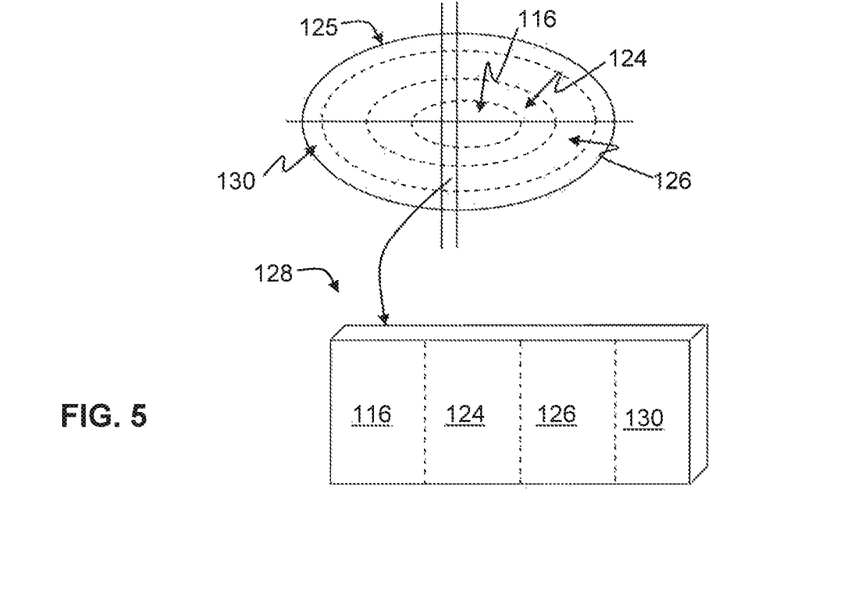
FIG. 5 is a schematic diagram of one embodiment of a method for forming a cut heterogeneous single crystal as described herein.

As illustrated in FIG. 5, a formed heterogeneous crystal 125 can be cut to form a single crystal 128, which can be coated with suitable dielectric materials for a desired use. This can create, e.g., a laser cavity single crystal 128 with successively an entry mirror (not shown), a single crystal layer 116 of undoped YAG, a single crystal layer 124 of YAG doped with an activator ion ($Yb^{3+}$ or $Nd^{3+}$ for example), a single crystal layer 126 of a saturable absorber ($Cr^{4+}$ doped YAG for example), a single crystal layer 130 of undoped YAG, and an exit mirror (not shown). Such a configuration allows for much higher pumping powers by minimizing thermal lensing and protecting the thin entry and exit films from lattice distortions that now happen away from the thin coatings. Such a crystal can serve as a laser cavity for very high pump powers (e.g., about 2 to about 100 W) creating pulse lasers emissions with extremely high peak power.

Additional layers can likewise be formed on a YAG-based substrate. For instance, a single layer of an undoped YAG host material can be formed for strength or for connection to a heat sink. In another embodiment, a layer can contain a suitable amount of gallium ions substituting for aluminum ions (typically between about 4 at. % and about 12 at. %) as well as some Lu ions substituting for Y ions (typically between about 3 at. % and about 8 at. %). These ions can be introduced as part of the feedstock in the form of oxides $Ga_2O_3$ and $Lu_2O_3$ or as other simple typical feedstock sources such as simple salts, halides nitrates, hydroxides or the like. The $Ga^{3+}$ ions can serve to increase the refractive index from YAG to achieve total internal reflectance, while $Lu^{3+}$ is smaller than $Y^{3+}$ and can serve to compensate the size to the lattice to the original YAG lattice dimensions. Epitaxial growth can be carried out according to a process as disclosed herein. The surface can be polished after growth and then placed in an autoclave and layer of about 1 mm undoped material can be grown at this surface as disclosed herein. The resultant product can be side pumped or end pumped with a suitable pump source to create a planar waveguide laser source.

Thus, a series of multiply doped composite crystal regions can be prepared on a single monolithic crystal with numerous layers each differing from one another with regard to presence or absence of doping ion, type or concentration of doping ion, combination of dopants, etc., each layer performing a specific function. For example, a single YAG heterogeneous crystal can be prepared that contains adjacent regions doped with $Ho^{3+}$, $Cr^{4+}$, $Tm^{3+}$, and no dopant, successively.

In one embodiment, additional layers can be grown in a separate reactor following formation of a previous layer to prevent any contamination from the dopant in adjacent layers, though this is not a requirement of disclosed processes. Thus, in this embodiment, the seed crystal of the additional process can be a heterogeneous, monolithic crystal formed in a previous process.

Dopants for a region of a crystal are not limited to any particular ions described as examples herein. In general, the preferred identity of a dopant can depend upon the desired function of the region and the YAG host material in the feedstock. For instance, in addition to $Nd^{3+}$ and $Yb^{3+}$, suitable activator ion dopants can include, without limitation, $Er^{3+}$, $Tm^{3+}$, $Ho^{3+}$, and the like. In general, all trivalent lanthanides (La to Yb, Sc and Y) and most other trivalent metal ions with gain active properties can be successfully doped into a YAG lattice using a hydrothermal growth method. Typically, all the rare earths from Ce to Yb can be incorporated into a trivalent host metal site as a dopant. Moreover, a region can include more than one dopant. For instance, a region can be formed of Yb,Er:YAG or Tm,Ho:YAG. Most dopants can be provided to the feedstock as a metal oxide, halide, or nitrate.

Any element in a host lattice can be varied according to disclosed methods, as desired. For instance, elements of a host lattice can be varied to adjust the refractive index and overall lattice size. Materials can be introduced to a region using appropriate sources in the feedstock (typically the dopant oxide, but occasionally the halide or nitrate salt). Other metal ions can be introduced as required by the desired function of the formed crystal regime. In one embodiment, a dopant ion can replace an optically inactive ion with a different charge. In such an embodiment another ion may also be introduced simultaneously to balance the charge in the lattice, as is generally known in the art.

Beneficially, through utilization of a hydrothermal growth method, higher concentrations of dopants can be incorporated in a region than is possible using conventional melt growth techniques. For instance, $Nd^{3+}$ dopant can be incorporated in a host at levels greater than about 2 at. %, or up to about 5 at. %, or up to about 10 at. %, or between about 2 at. % and about 10 at. %, which is much higher than the 1.5 at. % doping level available when utilizing a melt formation process. Of course, lower dopant concentrations are also encompassed herein. For instance, a dopant can be provided in a host material at a concentration between about 0.1 at. % and about 10 at. %. Larger dopant ion concentrations in a region are also encompassed. For example, a region can include about 50% dopant in YAG or $Lu_2O_3$ host, such as an erbium dopant.

The present disclosure may be better understood with reference to the following prophetic examples.

PROPHETIC EXAMPLE 1

A microlaser cavity crystal with 1 mm thick activator ion region with 1 at. % doped $Nd^{3+}$ activator and 0.5 mm thick Q-switch region doped with 0.05-1 at. % $Cr^{4+}$ saturable absorber can be formed. A boule of YAG doped with 1 at. % $Nd^{3+}$ in the form of single crystal of approximately 3 mm thickness and 1 square centimeter oriented such that the large planar face is the [100] orientation can be suspended near the top of a suitable autoclave lined with an inert noble metal (gold, silver or platinum).

A feedstock of YAG mixed with 0.5 mole % $CrO_2$ and 0.5 mole % CaO can be placed in the bottom of the autoclave. An aqueous fluid containing an appropriate mineralizer such as KOH, K2CO3, KF, KCl, KNO3 or related materials can be added. The concentration and identity of the mineralizer is a function of the desired rate of transport and layered crystal growth rate. Typical concentrations can range from but are not limited to about 1M to about 10M. In general, the higher the mineralizer concentration, the faster the growth rate of transported material.

The autoclave can be sealed and heated such that a temperature gradient is established whereby the bottom of the autoclave where the feedstock is located is heated to a higher temperature than the area near the top of the autoclave where the substrate crystal is located. Generally the preferred differential can range from about 20° C. to about 50° C. from the top to the bottom of the autoclave. For instance, the bottom of the autoclave can be heated to between about 600° C. and about 650° C. while the top of the autoclave can be heated to temperatures between about 550° C. and about 600° C. to achieve a single crystal growth rate of about 100 μm/day (a typical rate for refractory cubic oxides). The temperatures can then be held constant for five days, after which the autoclave can be cooled slowly to room temperature.

The resultant crystal can be cut in half across the length of the whole plate and, after kerf loss, can have a layer of about 1 mm thick layer of Nd doped gain region and 0.5 mm thick layer of 0.5 at. % doped $Cr^{4+}$ doped YAG Q-switch layer. The two end surfaces can be polished and coated with entry and exit mirror films. These can be cut into many bars or disks to form many 1.5 mm thick microlaser cavities suitable for pumping by a diode laser of typical wavelengths (808 nm for example).

PROPHETIC EXAMPLE 2

A microlaser cavity crystal with 1 mm thick activator ion region with 1% doped $Nd^{3+}$ activator and a 0.5 mm thick Q-switch region doped with 0.5% $Cr^{4+}$ saturable absorber can be formed. A boule of YAG doped with 1% $Nd^{3+}$ in the form of single crystal of approximately 3 mm thickness and 1 square centimeter can be oriented such that the large planar face is the [100] orientation and suspended near the top of a suitable autoclave lined with an inert noble metal (gold, silver or platinum).

A feedstock of $Y_2O_3$ and $Al_2O_3$ in appropriate ratios mixed with 0.5 mole % $CrO_2$ and 0.5 mole % CaO can be placed in the bottom of the autoclave. An aqueous fluid containing an appropriate mineralizer such as KOH, $K2CO_3$, KF, KCl, $KNO_3$ or related materials can be added. The concentration and identity of the mineralizer is a function of the desired rate of transport and layered crystal growth rate. Typical concentrations can range from but are not limited to about 1 to about 10M. In general, the higher the mineralizer concentration, the faster the growth rate of transported material.

The autoclave can be sealed and heated such that a temperature gradient is established whereby the bottom of the autoclave where the feedstock is located is heated to a higher temperature than the area near the top of the autoclave where the substrate crystal is located. For example, the temperature differential between the top and the bottom of the autoclave can range from about 20° C. to about 50° C. The bottom of the autoclave can be heated to between about 600° C. and about 650° C. while the top of the autoclave can be heated to temperatures between about 550° C. and about 600° C.

To obtain a growth rate of 100 μm/day (a typical rate for refractory cubic oxides), then the temperatures can be held constant for about five days, after which the autoclave can be cooled slowly to room temperature.

The resultant crystal can be cut in half across the length of the whole plate and, after kerf loss, can have a layer of about 1 mm thick layer of Nd doped gain region and 0.5 mm thick layer of 0.5% doped $Cr^4$ doped YAG Q-switch layer. The two plates can be polished and coated with entry and exit mirror films. These can be cut into many bars or disks to form many 1.5 mm thick microlaser cavities suitable for pumping by a diode laser of typical wavelengths (808 nm for example).

PROPHETIC EXAMPLE 3

A laser crystal cavity for higher power applications can be formed whereby the cavity can be pumped by a diode laser at powers greater than 1 W. A boule of YAG doped with 1% $Nd^{3+}$ in the form of single crystal of approximately 9 mm thickness and 1 square centimeter oriented such that the large planar face is the orientation can be suspended near the top of a suitable autoclave lined with an inert noble metal (gold, silver or platinum).

A feedstock of $Y_2O_3$ powder and $Al_2O_3$ in the form of granular chunks or a single piece of sapphire, in appropriate ratios, mixed with 0.5% (mole percent) $CrO_2$ and 0.5% (mole percent) CaO can be placed in the bottom of the autoclave. An aqueous fluid containing an appropriate mineralizer such as KOH, $K_2CO_3$, KF, KCl, $KNO_3$ or related materials is added. The concentration and identity of the mineralizer is a function of the desired rate of transport and layered crystal growth rate. Typical concentrations can range from but are not limited to about 1M to about 10M. In general, the higher the mineralizer concentration, the faster the growth rate of transported material.

The autoclave can be sealed and heated such that a temperature gradient is established whereby the bottom of the autoclave where the feedstock is located is heated to a higher temperature than the area near the top of the autoclave where the substrate crystal is located. The temperature differential from the top of the autoclave to the bottom of the autoclave can range from about 20° C. to about 50° C. The bottom of the autoclave can be heated to between about 600° C. to about 650° C. while the top of the autoclave can be heated to between about 550° C. and about 600° C.

The crystal growth rate can be about 50 μm/day is attained (a typical rate for refractory cubic oxides), and the temperatures can be held constant for 10 days, after which the autoclave is cooled slowly to room temperature.

The resultant crystal can be cut in half across the length of the whole plate and, after kerf loss, can have a layer of about 4 mm thick layer of Nd doped gain region and 0.5 mm thick layer of 0.5% doped $Cr^{4+}$ doped YAG Q-switch layer.

A plate resulting from the above treatment can be suspended in an autoclave containing a feedstock of pure undoped YAG powder or microcrystals, or a mixture of $Y_2O_3$ and excess $Al_2O_3$ in the form of granular chunks or a single piece of sapphire. An aqueous fluid containing an appropriate mineralizer such as KOH, $K_2CO_3$, KF, KCl, $KNO_3$ or related materials can be added. The concentration and identity of the mineralizer can be a function of the desired rate of transport and layered crystal growth rate. Typical concentrations can range from but are not limited to about 1M to about 10M. In general, a growth rate of about 30-50 μm/day can be established for high quality single crystals layers.

The resultant plates can be polished and coated with entry and exit mirror films. These can be cut into many bars or disks The resultant product includes a single crystal with two end caps with entry and exit mirrors and to form many 5.5 mm thick laser cavities suitable for pumping by a diode laser of typical wavelengths (808 nm for example) at powers greater than several watts.

While certain embodiments of the disclosed subject matter have been described using specific terms, such description is for illustrative purposes only, and it is to be understood that changes and variations may be made without departing from the spirit or scope of the subject matter.

What is claimed is:

1. A method for forming a monolithic heterogeneous crystal comprising heating and pressurizing an aqueous solution held within a reactor to develop a temperature differential between a first zone of the reactor and a second zone of the reactor, the reactor containing a garnet forming feedstock in the first zone and a garnet seed crystal in the second zone, the feedstock forming the same garnet as the garnet of the seed crystal, the feedstock including a source for a saturable absorber ion, wherein upon said heating and pressurizing growth of a garnet Q-switch crystal region is initiated on the garnet seed crystal to form a monolithic garnet product crystal, the composition of the Q-switch crystal region differing from the composition of the seed crystal such that the monolithic garnet product crystal is heterogeneous.

2. The method according to claim 1, the aqueous solution comprising a mineralizer.

3. The method according to claim 1, wherein the garnet seed crystal is a YAG seed crystal.

4. The method according to claim 1, the garnet seed crystal comprising an activator ion.

5. The method according to claim 1, the feedstock further comprising a source for an activator ion.

6. The method according to claim 1, the feedstock further comprising a source of an ion for balancing lattice charge of the Q-switch crystal region.

7. The method according to claim 1, wherein the seed crystal is a heterogeneous monolithic crystal.

8. The method according to claim 1, wherein the seed crystal comprises a region of the garnet that is undoped.

9. The method according to claim 1, wherein the reactor is lined with an inert noble metal.

10. The method according to claim 1, wherein the aqueous solution is pressurized to a pressure of between about 5 kpsi and about 30 kpsi.

11. The method according to claim 1, wherein the temperature of the second zone is between about 450° C. and about 650° C.

12. The method according to claim 1, wherein the temperature difference is between about 20° C. and about 100° C.

13. The method according to claim 1, further comprising cutting and polishing the monolithic heterogeneous product to form a smaller heterogeneous monolithic crystal.

14. The method according to claim 1, further comprising forming a new crystal region on the Q-switch region, the new crystal region differing in composition from the Q-switch region.

15. The method according to claim 14, wherein the new crystal region is a region of the garnet that is undoped.

16. The method according to claim 14, wherein the new crystal region is formed according to a method comprising heating and pressurizing an aqueous solution held within a second reactor to develop a temperature differential between a first zone of the second reactor and a second zone of the second reactor, the second reactor containing a garnet forming feedstock in the first zone, this garnet forming feedstock forming the same garnet as the garnet of the monolithic garnet product crystal, the second reactor containing the garnet product crystal in the second zone, wherein upon said heating and pressurizing growth of the new crystal region is initiated on the garnet product crystal.

17. The method according to claim 1, wherein the saturable absorber ion is included in the feedstock in a concentration between about 0.01 at. % and about 10 at. %.

* * * * *